(12) United States Patent
Kato et al.

(10) Patent No.: US 8,669,774 B2
(45) Date of Patent: Mar. 11, 2014

(54) PROBE PIN AND AN IC SOCKET WITH THE SAME

(75) Inventors: Yuji Kato, Tokyo (JP); Takeyuki Suzuki, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 281 days.

(21) Appl. No.: 13/042,693

(22) Filed: Mar. 8, 2011

(65) Prior Publication Data

US 2011/0248736 A1 Oct. 13, 2011

(30) Foreign Application Priority Data

Apr. 9, 2010 (JP) ................................. 2010-090474

(51) Int. Cl.
*G01R 1/067* (2006.01)

(52) U.S. Cl.
USPC ............. 324/755.05; 324/755.01; 324/755.11

(58) Field of Classification Search
USPC ........... 324/754, 755.05, 761; 439/66, 71, 73, 439/482, 700, 786, 824, 841
See application file for complete search history.

(56) References Cited

U.S. PATENT DOCUMENTS

| | | | | |
|---|---|---|---|---|
| 5,151,056 A | * | 9/1992 | McClune | 439/851 |
| 5,167,544 A | * | 12/1992 | Brinkman et al. | 439/856 |
| 6,464,511 B1 | * | 10/2002 | Watanabe et al. | 439/66 |
| 7,025,602 B1 | * | 4/2006 | Hwang | 439/66 |
| 7,256,593 B2 | * | 8/2007 | Treibergs | 324/754.05 |
| 7,467,952 B2 | * | 12/2008 | Hsiao et al. | 439/66 |
| 7,677,901 B1 | | 3/2010 | Suzuki et al. | |
| 2004/0137767 A1 | * | 7/2004 | Suzuki et al. | 439/73 |
| 2008/0180125 A1 | * | 7/2008 | Lee | 324/761 |
| 2009/0075529 A1 | * | 3/2009 | Johnston et al. | 439/824 |

FOREIGN PATENT DOCUMENTS

| | | |
|---|---|---|
| JP | U-52-9596 | 1/1977 |
| JP | A-4-62771 | 2/1992 |
| JP | A-2001-167812 | 6/2001 |
| JP | A-2003-109718 | 4/2003 |
| WO | WO 2009/084906 A2 | 7/2009 |

OTHER PUBLICATIONS

Feb. 7, 2012 Office Action issued in Japanese Patent Application No. 2010-090474 (w/ English Translation).
Oct. 4, 2013 Office Action issued in German Patent Application No. 102011013411.5 (w/ English Translation).

* cited by examiner

*Primary Examiner* — Vinh Nguyen
(74) *Attorney, Agent, or Firm* — Oliff PLC

(57) ABSTRACT

The probe pin includes a plunger formed of a sheet metal, and a coil spring unit formed of a metal wire and configured to hold the plunger thereon. In a developed state, the plunger includes first and second portions each of which has an upper contact strip, a wide portion, and a lower contact strip, and which are connected to each other via the wide portions formed in the first and second portions. The plunger is formed in a united manner by folding together the first and second portions along a boundary of the wide portions formed therein to thereby bring at least the wide portions into tight contact with each other.

5 Claims, 12 Drawing Sheets

FIG.1A
FIG.1B
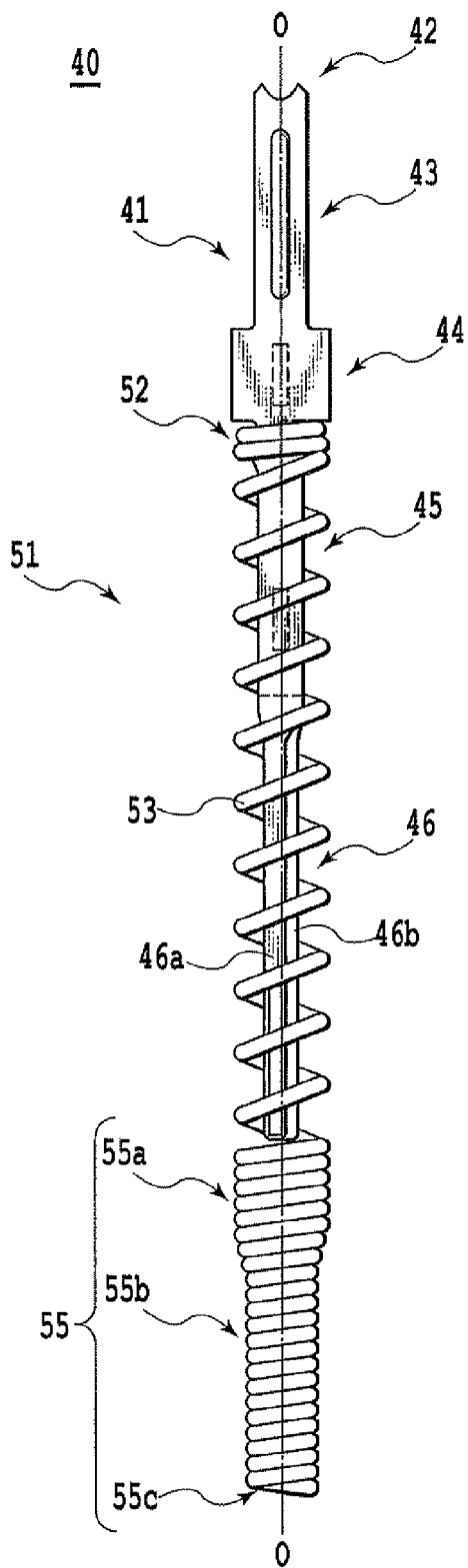
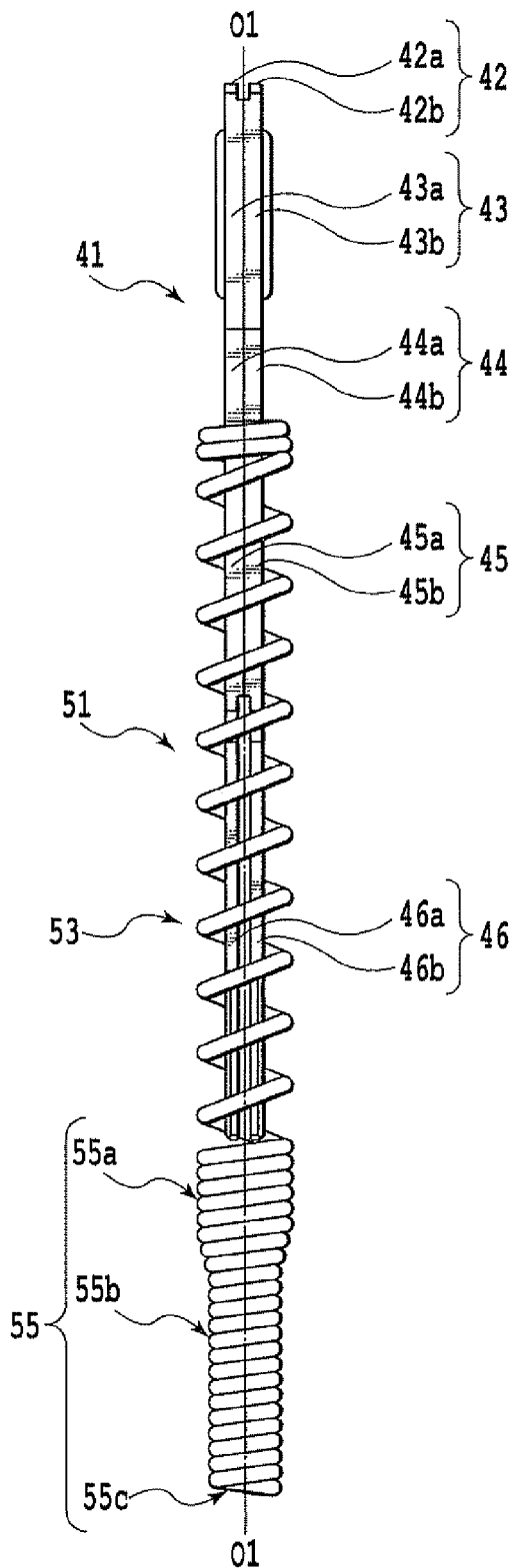

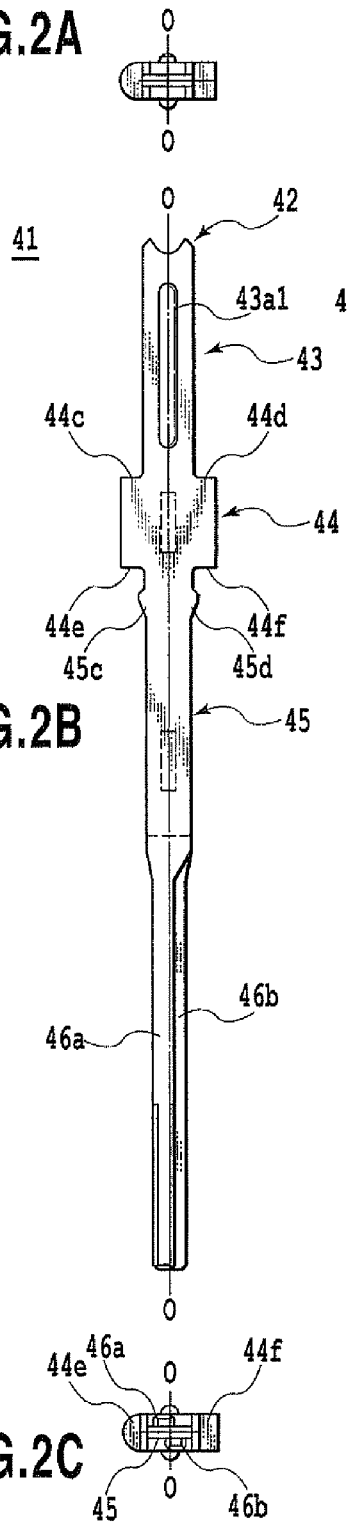
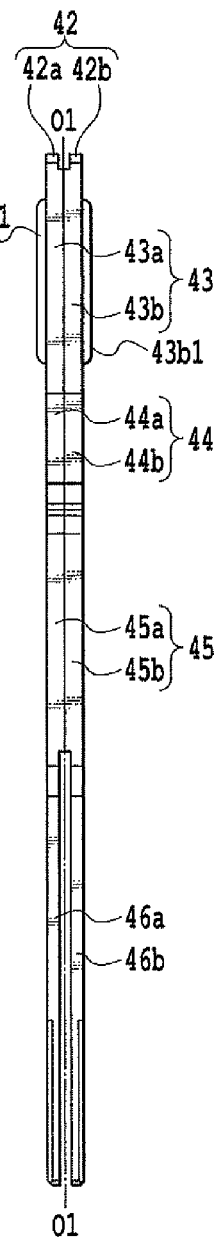
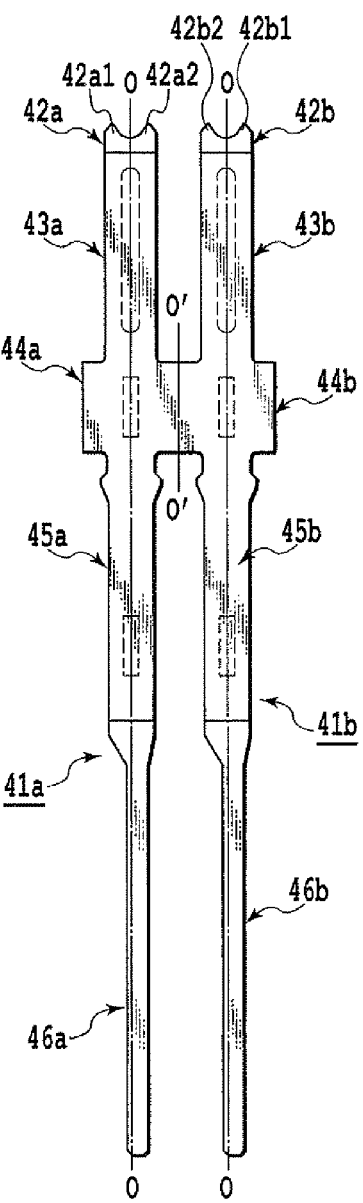
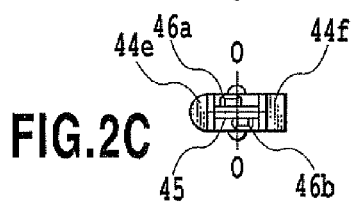

FIG.3A
FIG.3B
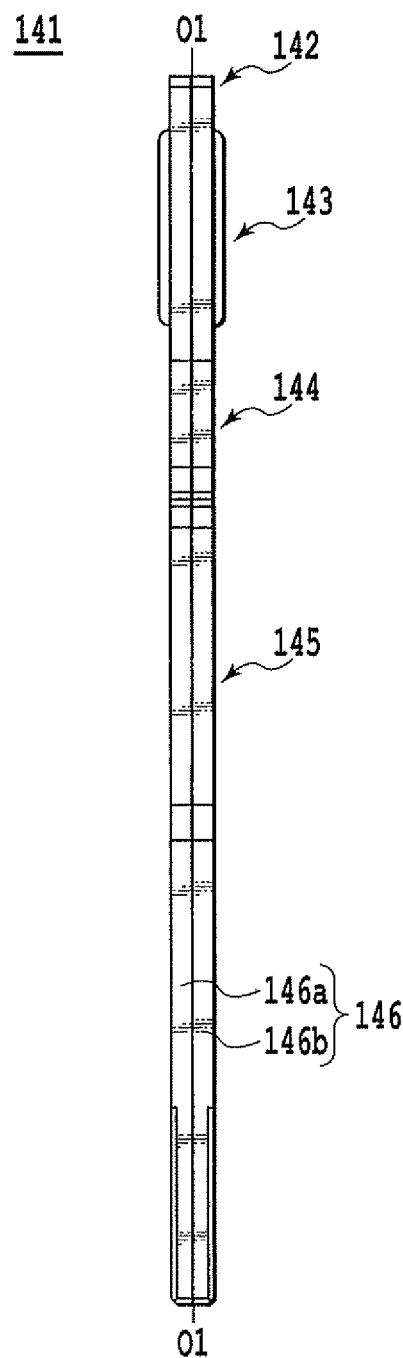
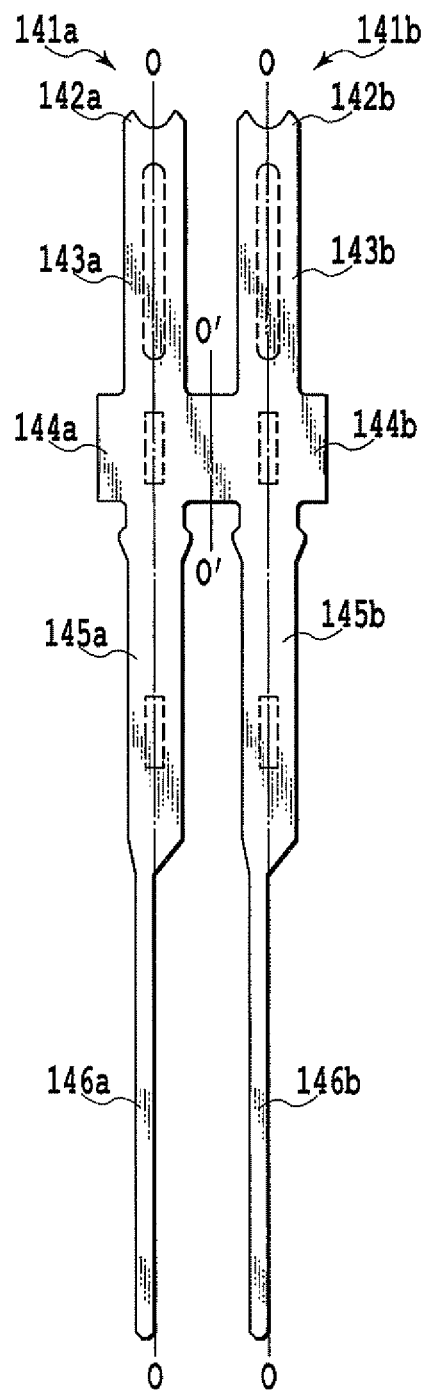

FIG.8A
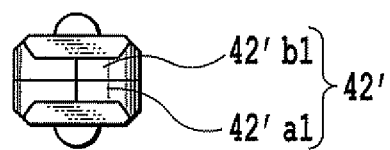
FIG.8B
FIG.8C
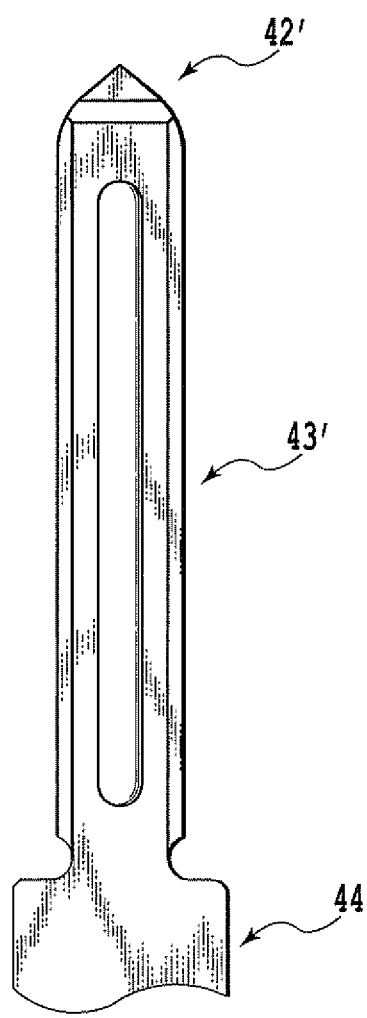
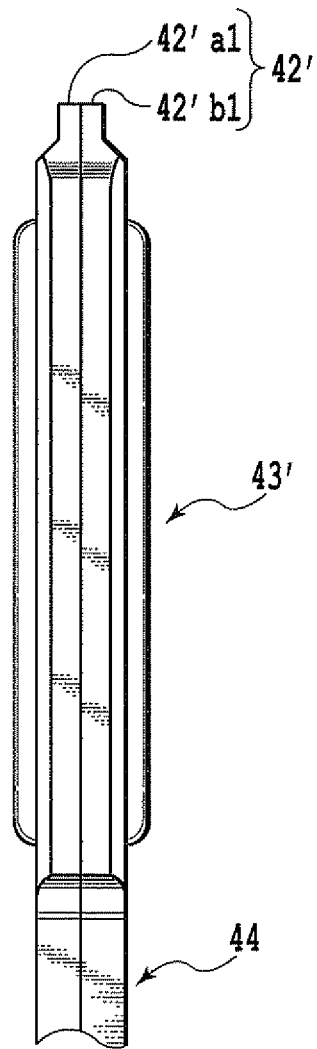

PROBE PIN AND AN IC SOCKET WITH THE SAME

This application claims the benefit of Japanese Patent Application No. 2010-090474, filed Apr. 9, 2010, which is hereby incorporated by reference herein in its entirety.

BACKGROUND OF THE INVENTION

1. Field of the Invention

The present invention relates to a probe pin and an IC socket with the same, the probe pin being used for the IC socket which electrically connects a semiconductor device as a first contact object, such as a semiconductor wafer, and a wiring substrate as a second contact object, and is used for electrical inspection of the semiconductor device.

2. Description of the Related Art

In a process of manufacturing semiconductor devices such as semiconductor wafers and integrated circuit packages (also referred to as "IC packages"), various tests are conducted for inspecting the presence or absence of defectives in the semiconductor devices. As one of these tests, an inspection has been known in which a test signal is sent to a semiconductor device as the inspection object to check the electrical characteristics of the semiconductor device. In general, such kind of test is conducted via an electrical-connection apparatus (hereinbelow, simply referred to as "IC socket") for semiconductor device configured to electrically connect the inspection object and a wiring substrate such as a test board. As such an IC socket, an IC socket disclosed in U.S. Pat. No. 7,677,901 has been known, for example.

In the IC socket disclosed in U.S. Pat. No. 7,677,901, probe pins are used as contacts each including a plunger, which is formed by punching a sheet metal into a predetermined shape via a press work, and a coil spring unit. Each of the plungers constituting the probe pins includes a first portion and a second portion, and is bent in a square U-shape with a connecting portion between the first portion and the second portion. The plungers are housed vertically movably in their respective through-holes each having a small-diameter portion and a large-diameter portion and being formed in an insulating base plate which constitutes a socket base of the IC socket. In addition, each plunger includes upper contact strips with three contact points which are so spread a plane and which an external contact point of a semiconductor device come into contact with. Moreover, the plunger is housed in the through-hole in such a manner that the leading ends of the three contact points of the plunger project upward from the through-hole. Furthermore, the plunger includes lower contact strips with two contact points that can come into resilient contact with a slimly wound portion of a tight wound portion of the coil spring unit, which constitutes the probe pin and includes a spring portion configured to resiliently urge the plunger upward.

In recent years, along with the increase in the density of the external contact points arranged on the semiconductor device as the inspection object, a finer pitch arrangement (also referred to as "narrower pitch arrangement") has been required for the probe pins (also referred to as "contacts") of the IC socket. The probe pins of the IC socket disclosed in the description of U.S. Pat. No. 7,677,901 described above are excellent in reliability, durability, and stability in contact with the external contact points of a semiconductor device. However, each plunger is bent in a square U-shape with the connecting portion between the first and second portions, and thus the first and second portions are disposed with a gap therebetween. Accordingly, it is difficult to achieve a finer pitch in the arrangement of the probe pins.

An object of the present invention is to provide a probe pin and an IC socket with the same, the probe pin being used for the IC socket and achieving a suitability for a finer pitch arrangement thereof while having the reliability, durability, and contact reliability thereof impaired as little as possible from those of conventional probe pins.

SUMMARY OF THE INVENTION

In order to achieve the object described above, a probe pin according to the present invention includes a plunger formed of a sheet metal, and a coil spring unit formed of a metal wire and configured to hold the plunger thereon. In a developed state, the plunger includes a first portion and a second portion each of which has an upper contact strip, a wide portion, and a lower contact strip, and which are connected to each other via the wide portions formed in the first and second portions. The plunger is formed in a united manner by folding together the first and second portions along a boundary of the wide portions formed in the first and second portions to thereby bring at least the wide portions formed in the first and second portions into tight contact with each other.

Moreover, in the probe pin according to the present invention, it is preferable that a resilient deformation portion is formed at a lower portion of each of the lower contact strips formed in the first and second portions; and that, when the first and second portions are folded together to form the plunger, the lower contact strips formed in the first and second portions are brought into tight contact with each other except for the resilient deformation portions and form a unitary body whereas the resilient deformation portions form paired resilient deformation portions that are resiliently deformable with respect to each other.

Furthermore, a contact point portion having a contact point may be formed at an upper portion of each of the upper contact strips formed in the first and second portions. Here, when the first and second portions are folded together to form the plunger, the upper contact strips formed in the first and second portions may be brought into tight contact with each other except for the contact point portions and form a unitary body whereas the contact point portions form contact point portions on which a plurality of the contact points are so spread in a plane. Instead, the upper contact strips formed in the first and second portions may be brought into tight contact with each other and form a unitary body and the contact point portions form a single contact point.

In addition, in the probe pin according to the present invention, it is preferable that a protrusion is formed on any one of the first and second portions, and an opening or recess is formed in the other of the first and second portions, the protrusion being press-fitted into the opening or recess when the first and second portions are folded together to form the plunger.

According to the probe pin of the present invention, the first and second portions of the plunger are united together as they are folded together and brought into tight contact with each other. The plunger formed to have two layers has a greater strength, and also the thickness of the plunger can be reduced. Accordingly, the width and thickness of the plunger can be reduced without deteriorating the durability thereof, hence allowing a suitability for the narrower pitch arrangement. Moreover, it is possible to secure gaps for the resilient deformation of the paired resilient deformation portions, even when the probe pin is so formed as to be suitable for the narrower pitch arrangement as described above. Accordingly, the paired resilient deformation portions can securely come into contact with an inner circumferential surface of a tight wound portion, so that a short circuit is created and a high-speed transmission is achieved like conventional cases. Furthermore, the contact point portions of the upper contact strips can maintain the same contact reliability as the conventional cases even when the probe pin is so formed as to be suitable for the narrower pitch arrangement.

Further features of the present invention will become apparent from the following description of exemplary embodiments (with reference to the attached drawings).

BRIEF DESCRIPTION OF THE DRAWINGS

FIG. 1A is a front view of a probe pin according to an embodiment of the present invention;

FIG. 1B is a side view of the probe pin shown in FIG. 1A;

FIG. 2A is a top view of a plunger constituting the probe pin shown in FIGS. 1A and 1B;

FIG. 2B is a front view of the plunger shown in FIG. 2A;

FIG. 2C is a bottom view of the plunger shown in FIG. 2A;

FIG. 2D is a side view of the plunger shown in FIG. 2A;

FIG. 2E is a development view of the plunger shown in FIG. 2A;

FIG. 3A is a side view showing a modification of the plunger shown in FIGS. 2A to 2E;

FIG. 3B is a development view of the plunger shown in FIG. 3A;

FIG. 8A is a top view showing a modification of upper contact strips of the plunger shown in FIGS. 2A to 2E;

FIG. 8B is a front view of the upper contact strips of the plunger shown in FIG. 8A;

FIG. 8C is a side view of the upper contact strips of the plunger shown in FIG. 8A;

DESCRIPTION OF THE EMBODIMENTS

Hereinbelow, preferred embodiments of a probe pin according to the present invention will be described using the drawings.

First of all, an IC socket to which the probe pin according to the present invention is applied will be described briefly by using FIG. 5. The IC socket to which the probe pin according to the present invention is applied has a structure that is the same as conventional ones in essence. Thus, for details of the IC socket, see Patent Literature 1, for example.

Figure 5:
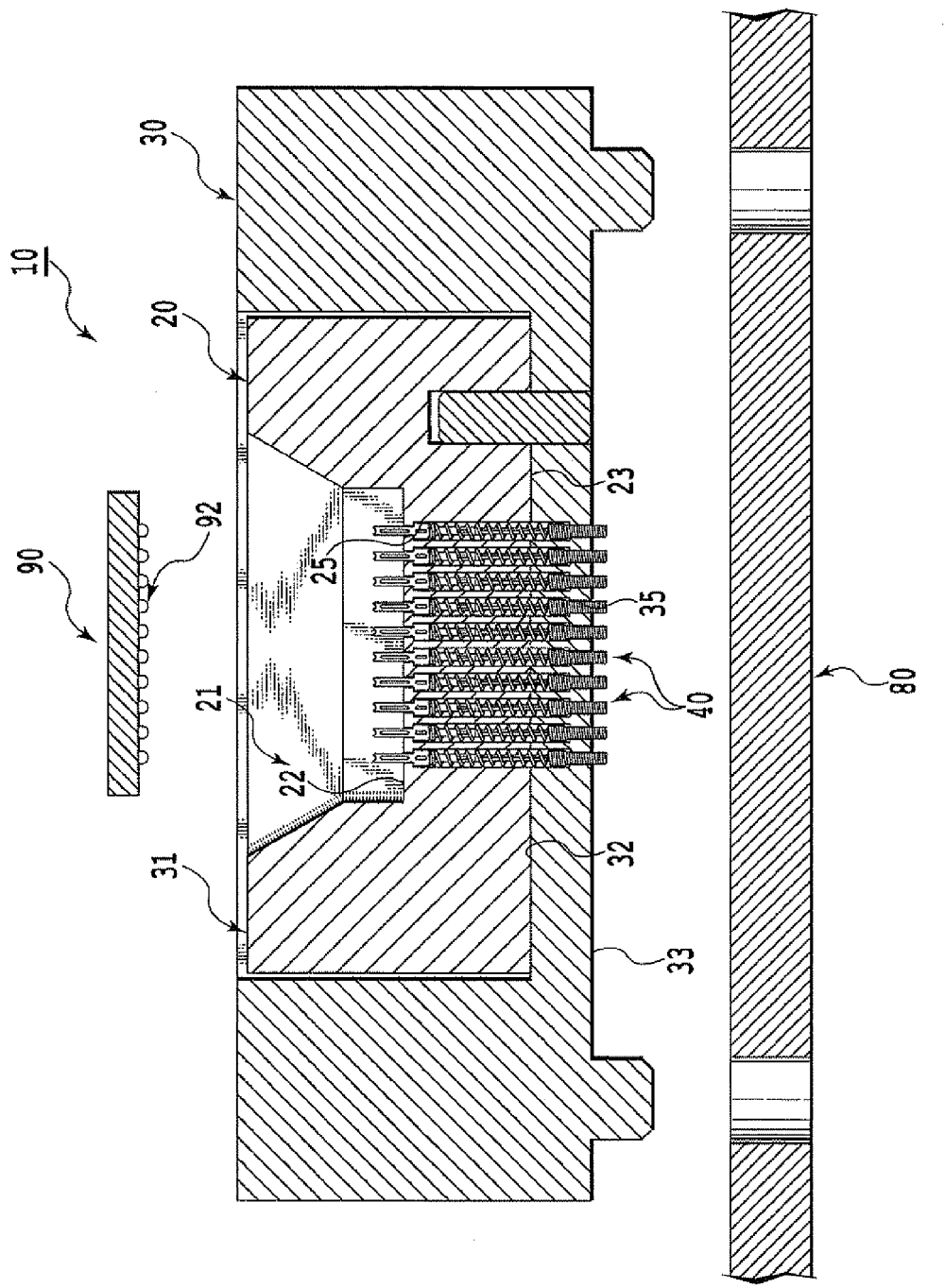
FIG. 5 is a schematic cross-sectional view of an IC socket in which the probe pins shown in FIGS. 1A and 1B are installed.

As shown in FIG. 5, the IC socket 10 mainly includes a first base member 20, a second base member 30, and multiple probe pins 40 as contacts. In FIG. 5, reference sign 80 designates a second contact object which the probe pins 40 of the IC socket 10 come into contact with. The second contact object is a wiring substrate such as a test board to which the IC socket 10 is to be attached. Reference sign 90 designates a first contact object which comes into contact with the probe pins 40 of the IC socket 10. The first contact object is an IC package to be mounted on the IC socket 10. The IC package 90 as the first contact object is electrically connected to the wiring substrate 80 as the second contact object via the IC socket 10.

The first base member 20 is formed by molding an electrically insulative synthetic resin material, has a substantially parallelepiped shape, and is housed in a housing recess 31 formed in the second base member 30.

A placing recess 21 to house the IC package 90 is formed in a center portion of the first base member 20. Multiple first through-holes 25 are formed to penetrate from a lower surface 23 of the first base member 20 to a bottom surface 22 of the placing recess 21 in such an arrangement as to correspond respectively to multiple external contact points 92 such as solder balls provided to the IC package 90 to be mounted on the IC socket 10. The multiple first through-holes 25 are arranged in a matrix pattern in the same manner as the arrangement of the multiple external contact points 92 of the IC package 90. Each of the first through-holes 25 define probe-pin housing spaces (described later) for housing the probe pins 40 in cooperation with respective second through-holes 35 (described later) provided to the second base member 30. Meanwhile, in this embodiment, the IC package 90 to be mounted is illustrated as an IC package of a ball grid array (BGA) type including external contact points 92 such as solder balls. However, the IC package to be mounted is not limited to this, and may be of any type such as a land grid array (LGA) type or a quad flat package (QFP) type formed into a gull-wing shape.

Figure 6A:
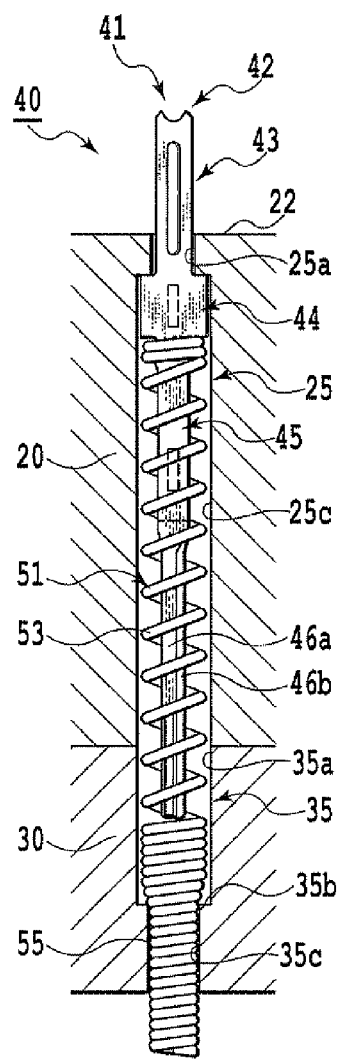
FIG. 6A is a partial enlarged cross-sectional view of the IC socket for describing movement of the probe pin shown in FIGS. 1A and 1B, and shows the same state as that in FIG. 5 where the probe pins are attached to the IC socket.
Figure 6B:
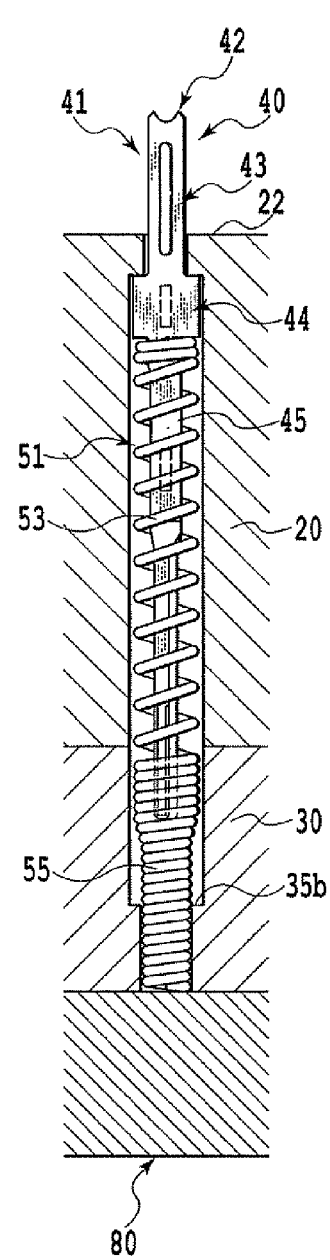
FIG. 6B is a schematic cross-sectional view of the same IC socket as that in FIG. 6A, and shows a state where the IC socket is attached to a wiring substrate.
Figure 6C:
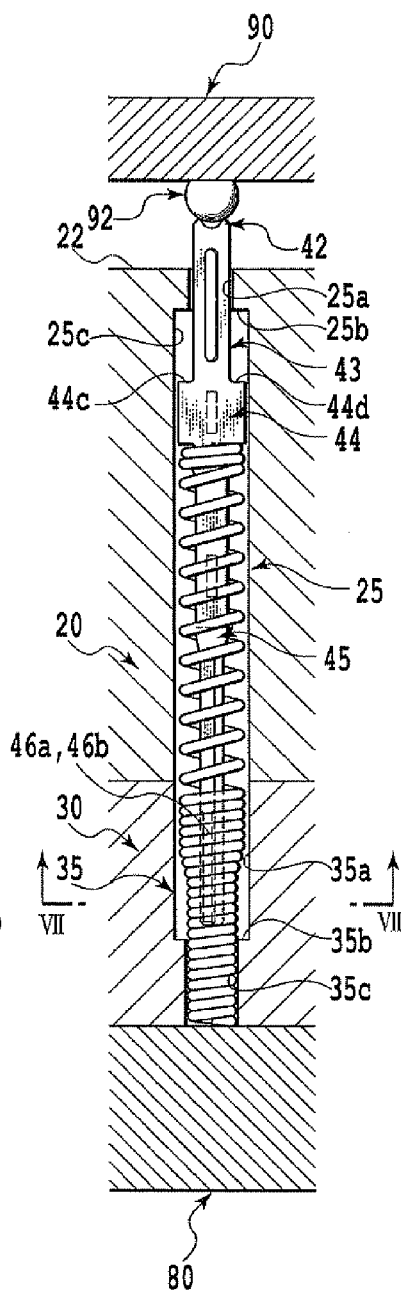
FIG. 6C is a schematic cross-sectional view of the same IC socket as that in FIG. 6A, and shows a state where a semiconductor device is attached to the IC socket in the state of FIG. 6B.

As shown in FIGS. 6A to 6C in detail, the first through-holes 25 each include, from the top, a cylindrical small-diameter portion 25a, a shoulder portion 25b, and a cylindrical large-diameter portion 25c. The small-diameter portion 25a houses an upper contact strip 43 of a plunger 41 of the probe pin 40. Here, the length of the small-diameter portion 25a is set to such a length that a contact point portion 42 of the upper contact strip 43 projects upward from the bottom surface 22 of the placing recess 21 by a sufficient amount. The large-diameter portion 25c houses a wide portion 44 of the plunger 41 and a spring portion 53 of a coil spring unit 51, the plunger 41 and the coil spring unit 51 constituting the probe pin 40. The shoulder portion 25b is formed between the small-diameter portion 25a and the large-diameter portion 25c. As shown in FIGS. 5 and 6A, when assembled as a part of the IC socket 10, the shoulder portion 25b is abutted against by the wide portion 44 of the plunger 41, and holds the probe pin 40 within the probe-pin housing space in a state of slightly compressing the probe pin 40.

Like the first base member 20, the second base member 30 is formed by molding an electrically insulative synthetic resin material and has a substantially parallelepiped shape. The housing recess 31 of a substantially parallelepiped shape opening upward is formed in a center portion of the second base member 30. The first base member 20 is housed in the housing recess 31 and fixed thereto with a fixing member such as a bolt.

The multiple second through-holes 35 are formed to penetrate from a lower surface 33 of the second base member 30 to a bottom surface 32 of the housing recess 31 in such an arrangement as to correspond respectively to the multiple first through-holes 25 provided to the first base member 20. Each of the second through-holes 35 define the probe-pin housing spaces for housing the probe pins 40 in cooperation with the respective first through-holes 25 provided to the first base member 20. Accordingly, when assembled as a part of the IC socket 10, the multiple second through-holes 35 share a center line with their respective first through-holes 25 and are arranged in the matrix.

As shown in FIG. 6A, the second through-holes 35 each include, from the top, a cylindrical large-diameter portion 35a, a shoulder portion 35b, and a cylindrical small-diameter portion 35c. The large-diameter portion 35a houses a lower portion of the spring portion 53 of the coil spring unit 51 and a guiding portion 55a of the tight wound portion 55 of the coil spring unit 51. The small-diameter portion 35c houses a slimly wound portion 55b of the coil spring unit 51 of the probe pin 40. Here, the length of the small-diameter portion 35c is set to such a length that a contact point 55c of the slimly wound portion 55b projects downward from the lower surface 33 by a sufficient amount. Like the first through-hole 25, the shoulder portion 35b is formed between the large-diameter portion 35a and the small-diameter portion 35c. As shown in FIGS. 5 and 6A, when assembled as a part of the IC socket 10, the shoulder portion 35b is abutted against by the guiding portion 55a of the tight wound portion 55 of the coil spring unit 51, and holds the probe pin 40 within the contact housing space.

Next, embodiments of the probe pin 40 according to the present invention will be described using FIGS. 1A to 12B. FIGS. 1A and 1B show an embodiment of the probe pin 40 according to the present invention. As shown in FIGS. 1A and 1B, the probe pin 40 includes the plunger 41 and the coil spring unit 51. Moreover, in the front view, the probe pin 40 has a center line O-O as shown in FIG. 1A. In the side view, the probe pin 40 has a center line O1-O1 as shown in FIG. 1B. The probe pin 40 is formed symmetrically with respect to the center lines O-O and O1-O1. When assembled as a part of the IC socket 10, the probe pin 40 is housed in the probe-pin housing space as shown in FIGS. 5 and 6A.

FIGS. 2A to 2E show details of the plunger 41 of the probe pin 40 according to the present invention shown in FIGS. 1A and 1B. As shown in FIG. 2B, the plunger 41 includes the upper contact strip 43, the wide portion 44, and lower contact strip 45. The plunger 41 is formed by punching and bending a conductive sheet metal.

To be specific, the plunger 41 is formed by first punching a sheet metal to obtain a shape in which a first portion 41a and a second portion 41b are connected to each other, the first portion 41a and the second portion 41b having shapes substantially the same and formed to be symmetrical with respect to a fold line O'-O', as shown in the development in FIG. 2E. The first portion 41a includes an upper contact strip 43a, a wide portion 44a, and a lower contact strip 45a, while the second portion 41b includes an upper contact strip 43b, a wide portion 44b, and a lower contact strip 45b. The first and second portions 41a and 41b are connected to each other via their wide portions 44a and 44b. Subsequently, the first and second portions 41a and 41b are folded together along the fold line O'-O', which is the boundary of the wide portions 44a and 44b, to thereby form a plunger 41. In other words, by folding together the first and second portions 41a and 41b along the fold line O'-O', the first and second portions 41a and 41b come to overlap each other in a way to make tight contact therebetween, so that a united plunger 41 is formed. Note that in this embodiment, no contact is made between the contact point portions 42a and 42b formed at upper end portion of the upper contact strip 43, as well as between resilient deformation portions 46a and 46b formed at lower end portion of the lower contact strip 45, as will be described later. In fact, at these positions, the first and second portions 41a and 41b are disposed with a gap therebetween as shown in FIG. 2D. Thus, the probe pin 40 according to the present invention may be understood as that in which the first and second portions 41a and 41b can be united together when at least the wide portions 44 are brought into tight contact with each other after the first and second portions 41a and 41b are folded together.

Figure 12A:
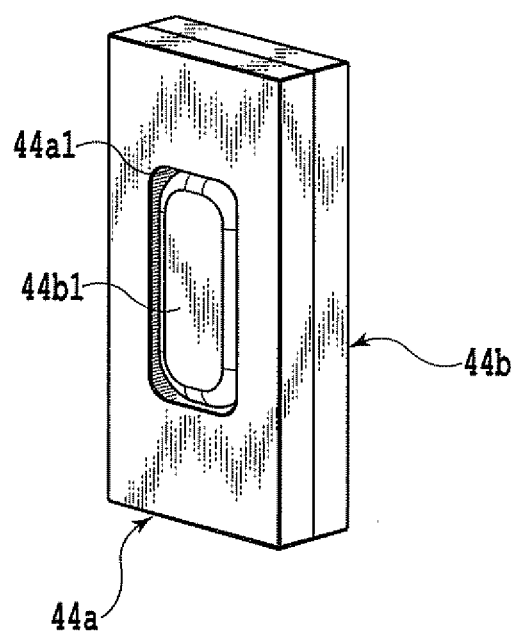
FIG. 12A shows first joining means for fixing a first portion and a second portion of the plunger shown in FIGS. 2A and 2E to each other.
Figure 12B:
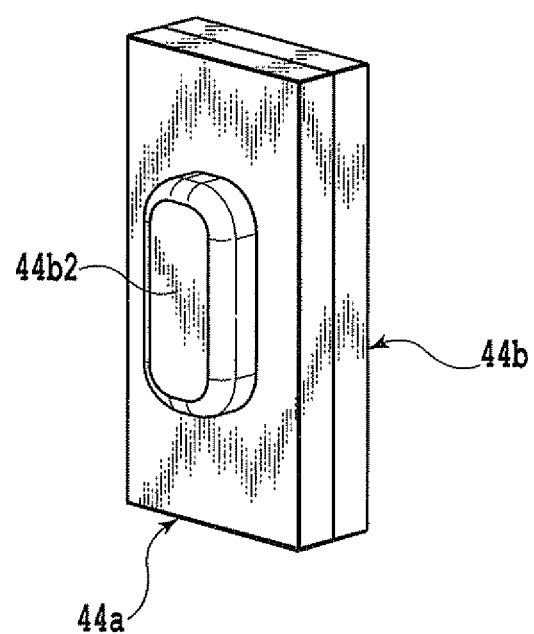
FIG. 12B shows second joining means for fixing the first portion and the second portion of the plunger shown in FIGS. 2A and 2E to each other.

To achieve highly tight contact between the first and second portions 41a and 41b, joining means as shown in FIG. 12A or 12B can be employed. The joining means shown in FIG. 12A will be now described. In the wide portion 44a of the first portion 41a, an opening 44a1 penetrating through the wide portion 44a is formed in advance. On the wide portion 44b of the second portion 41b, a protrusion 44b1 designed to be fitted (or press-fitted) into the opening 44a1 is formed in advance. At the same time as when the first and second portions 41a and 41b are folded together, the protrusion 44b1 is fitted (or press-fitted) into the opening 44a1, thus joining the wide portions 44a and 44b together. As a result, the first and second portions 41a and 41b come into tight contact with each other and united together. Note that unlike FIG. 12A, the opening 44a1 and the protrusion 44b1 may be provided to the second and first portions 41b and 41a, respectively. Moreover, as shown in FIG. 12B, instead of the opening 44a1, the wide portion 44a of the first portion 41a may be provided with a recess 44a2 into which the protrusion 44b1 is fitted (or press-fitted) to achieve the uniting. In the case of FIG. 12B, when the first and second portions 41a and 41b are folded together, the protrusion 44b1 of the second portion 41b is fitted (or press-fitted) into the recess 44a2 of the first portion 41a and thereby unites the first and second portions 41a and 41b together. In this embodiment, the joining means of the first and second portions 41a and 41b are provided to their respective wide portions as shown in FIGS. 12A and 12B, but are not limited to this. The joining means may be provided to the upper contact strips or the lower contact strips. By achieving highly tight contact between the first and second portions 41a and 41b as described above, the first and second portions 41a and 41b can maintain the tight contact therebetween even when the IC package 90 comes into contact with the probe pin 40. Accordingly, it is possible to achieve stable contact between the IC package 90 and the probe pin 40.

Returning to FIGS. 2A to 2E, the upper contact strips 43 of the plunger 41 includes the contact point portion 42, which the external contact point 92 of the IC package 90 comes into contact with, at its upper end portion. As shown in FIG. 2D, the upper contact strip 43 according to this embodiment is so designed that the upper contact strips 43a and 43b of the first and second portions 41a and 41b are in tight contact with each other, except for its contact point portion 42. In this embodiment, at the stage of the development shown in FIG. 2E, contact point portions 42a and 42b provided respectively to the first and second portions 41a and 41b are made thinner in advance by being squashed (crushed flatly) via a press work or the like. Thus, the contact point portions 42a and 42b make no contact with each other as shown in FIG. 2D when the first and second portions 41a and 41b are folded together. In addition, in this embodiment, a pair of contact points 42a1 and 42a2 and a pair of contact points 42b1 and 42b2 are formed respectively on the contact point portions 42a and 42b provided to the first and second portions 41a and 41b (see FIG. 2E). For this reason, the contact point portion 42 in this embodiment is formed such that the multiple contact points 42a1, 42a2, 42b1 and 42b2 are disposed with the spread in a plane. In this embodiment, the contact points provided to the first and second portions 41a and 41b are arranged to coincide with each other in the front view as shown in FIG. 2B, but are not limited to this. If design allows, the contact points may be formed to be offset from each other in the front view. Further, the numbers of contact points provided to the first and second portions 41a and 41b may be the same or different. In this embodiment, the upper contact strip 43 includes ribs 43a1 and 43b1 for reinforcement, respectively. The durability of the upper contact strip 43 supporting the contact point portion 42 which the external contact point 92 of the IC package 90 comes into contact with may decrease as the thickness and width of the probe pin 40 are set to be smaller due to the narrower pitch arrangement. However, providing the ribs 43a1 and 43b1 can prevent such a decrease.

Note that the structure of the contact point portions 42 is not limited to the structure as described above. The contact point portions may be formed to be completely in tight contact with each other as in modifications shown in FIGS. 3A and 3B, FIGS. 4A and 4B, and FIGS. 8A to 8C. Also, as shown in FIGS. 9A to 9C and FIGS. 10A and 10B, the contact point portion may be formed only on one of the first and second portions. The upper contact strip 43 including the contact point portion 42 may be configured in such a manner a that the upper contact strips 43a and 43b formed in the first and second portions 41a and 41b may be made thinner in advance by being squashed (crushed flatly) via a press work or the like to be formed like a modification shown in FIG. 10C. Thus, in the case of the upper contact strips 43 shown in FIG. 10C, the upper contact strips 43a and 43b of the first and second portions 41a and 41b are not in contact with each other in a most part. Moreover, in the case of the upper contact strips 43 shown in FIG. 10C, the upper contact strips 43a and 43b are reinforced by making them curve in the width direction, instead of providing the ribs 43a1 and 43b1 for reinforcement as in the case of this embodiment. In any case, the shape of the contact point portion 42 or the upper contact strip 43 including the contact point portion 42 can be set to a shape that is appropriate for the shape of the external contact point 92 of the IC package 90 which comes into contact therewith.

The wide portion 44 of the plunger 41 in this embodiment includes upper shoulder portions 44c and 44d on the left and right sides thereof. The wide portion 44 therefore continues to the upper contact strip 43 in a stepped shape via the upper shoulder portions 44c and 44d. When assembled as a part of the IC socket 10, the left and right upper shoulder portions 44c and 44d of the wide portion 44 abut the shoulder portion 25a of the first through-hole 25 to hold the probe pin 40 within the contact housing space or the probe-pin housing space.

The wide portion 44 of the plunger 41 in this embodiment also includes lower shoulder portions 44e and 44f on the left and right sides thereof. The wide portion 44 therefore continues to the lower contact strip 45 in a stepped shape via the lower shoulder portions 44e and 44f. When assembled as a part of the IC socket 10, the lower shoulder portions 44e and 44f of the wide portion 44 abut a supporting portion 52 of the spring portion 53 of the coil spring unit 51. With the lower shoulder portions 44e and 44f making contact with the supporting portion 52, the plunger 41 is supported by the coil spring unit 51 vertically movably in the probe-pin housing space. With these taken into consideration, the width of the wide portion 44 should be set desirably to a size that is larger than the inner diameters of the small-diameter portion 25a of the first through-hole 25 and the spring portion 53 but substantially equal to the outer diameter of the spring portion 53.

Next, when assembled as a part of the probe pin 40, the lower contact strip 45 of the plunger 41 in this embodiment is disposed inward of the spring portion 53 of the coil spring unit 51, as shown in FIGS. 1A and 1B. The lower contact strip 45 in this embodiment includes paired resilient deformation portions 46a and 46b (hereinbelow, also collectively referred to as "resilient deformation portions 46") formed at lower portion thereof. The paired resilient deformation portions 46a and 46b come into contact with an inner circumferential surface of the slimly wound portion 55b of the coil spring unit 51, when the plunger 41 is pushed downward as shown in FIG. 6C. Meanwhile, it is desirable to form protrusions 45c and 45d on the lower contact strip 45 so that the coil spring unit 51 can be held on the plunger 41. Such a configuration facilitates the handling of the probe pin 40 and thereby facilitates the assembling of the IC socket 10.

In this embodiment, the lower contact strips 45 are so designed that, when the first and second portions 41a and 41b are folded together to form the plunger 41, the lower contact strips 45a and 45b formed in the first and second portions 41a and 41b come into tight contact with each other except for the paired resilient deformation portions 46. In other words, the paired resilient deformation portions 46a and 46b are not in contact with each other but are disposed with a gap therebetween as shown in FIGS. 2C and 2D. Hence, the resilient deformation portions 46a and 46b are formed deformable with respect to each other.

Figure 7A:
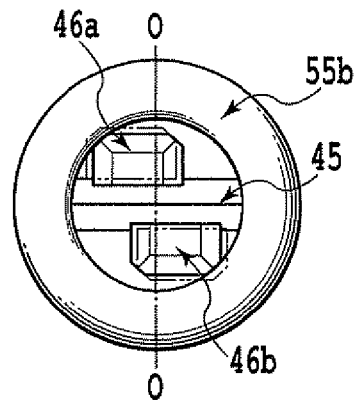
FIG. 7A is a partial enlarged cross-sectional view of a part taken along the VII-VII line of FIG. 6C, is for describing the contact of lower contact strips of the plunger of the probe pin according to the present invention with a tight wound portion of a coil spring unit, and shows a mode of how the lower contact strips of the plunger shown in FIGS. 2A to 2E comes into contact with the tight wound portion.

To be specific, in this embodiment, at the stage of the development shown in FIG. 2E, the resilient deformation portions 46a and 46b provided to the first and second portions 41a and 41b are formed thinner in advance by being squashed with a press or the like, as in the case of the contact point portions 42. Thus, the resilient contact portions 46a and 46b do not come into contact with each other as shown in FIG. 2D when the first and second portions 41a and 41b are folded together, whereby the resilient contact portions 46a and 46b are made resiliently deformable in directions toward each other. Further, in this embodiment, as shown in FIG. 2E, each of the resilient deformation portions 46a and 46b lies over the corresponding center line O-O but is disposed disproportionately on the left side of the center line O-O. Thus, each of the resilient deformation portions 46a and 46b is not formed symmetrically with respect to the center line O-O. In addition, the resilient deformation portions 46a and 46b are neither formed to be situated symmetrically to each other with respect to the fold line O'-O'. Specifically, the resilient deformation portions 46a and 46b according to this embodiment are so disposed that they are offset from each other left/rightward in the front view whereas symmetrical to each other with respect to the center line O1-O1 in the side view, as shown in FIGS. 2B to 2D. To put it differently, the paired resilient deformation portions 46a and 46b in this embodiment are disposed diagonally with a gap therebetween as shown in FIG. 2C. As the plunger 41 of the probe pin 40 is pushed downward as shown in FIG. 6C, the paired resilient deformation portions 46a and 46b enter the slimly wound portion 55b. As a result, each of the resilient deformation portions 46a and 46b of this embodiment comes into contact with the inner circumferential surface of the slimly wound portion 55b and resiliently deforms diagonally toward each other from a portion illustrated in the dashed line to a portion illustrated the solid line as shown in FIG. 7A. The resilient deformation portions 46a and 46b illustrated by the dashed lines in FIG. 7A are in a free state where the resilient deformation portions 46a and 46b are situated inward of the spring portion 53 of the coil spring unit 55 and no force is being applied thereto.

In this embodiment, the resilient deformation portions 46a and 46b resiliently deform diagonally toward each other as described above. Hence, it is desirable to chamfer the resilient deformation portions 46a and 46b at portions thereof that come into contact with the inner circumferential surface of the slimly wound portion 55b. Doing so allows smooth diagonal movement of the resilient deformation portions 46a and 46b, and also allows better contact between the resilient deformation portions 46a and 46b and the inner circumferential surface of the slimly wound portion 55b.

Figure 7B:
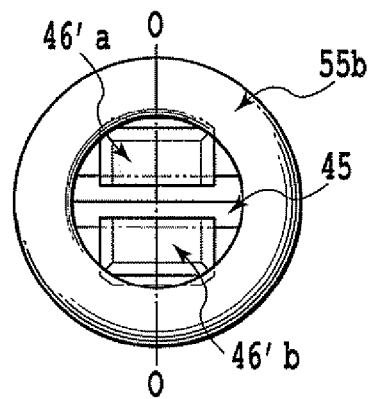
FIG. 7B is a partial enlarged cross-sectional view similar to FIG. 7A, and shows a mode of how a first modification of the lower contact strips of the plunger shown in FIGS. 2A to 2E comes into contact with the tight wound portion.
Figure 7C:
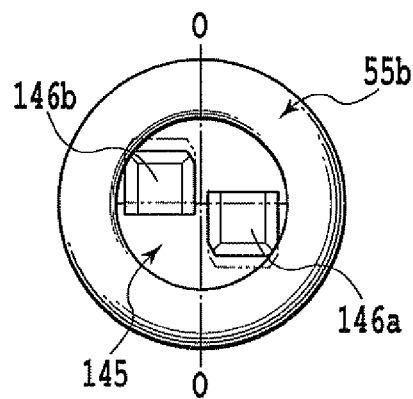
FIG. 7C is a partial enlarged cross-sectional view similar to FIG. 7A, and shows a mode of how a second modification of the lower contact strips of the plunger shown in FIGS. 2A to 2E comes into contact with the tight wound portion.
Figure 7D:
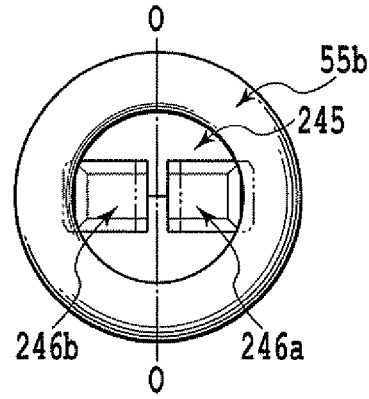
FIG. 7D is a partial enlarged cross-sectional view similar to FIG. 7A, and shows a mode of how a third modification of the lower contact strips of the plunger shown in FIGS. 2A to 2E comes into contact with the tight wound portion.

Note that the configuration of the paired resilient deformation portions 46a and 46b is not limited to the structure described above. The resilient deformation portions 46a and 46b may be formed as shown in any of FIGS. 7B to 7D. Paired resilient deformation portions 46'a and 46'b shown in FIG. 7B are disposed to coincide with each other in the front-rear direction (i.e., in the direction perpendicular to the document's surface) in the front view of the plunger 41 as shown in FIG. 2B. In other words, in this embodiment, the resilient deformation portions 46'a and 46'b formed respectively for the first and second portions 41a and 41b are each formed symmetrically with respect the corresponding center line O-O in the development shown in FIG. 2E. A pair of resilient deformation portions 146a and 146b and a pair of resilient deformation portions 246a and 246b shown respectively in FIGS. 7C and 7D are those employed in a modification of a plunger 141 in FIGS. 3A and 3B and in a modification of plunger 241 in FIGS. 4A and 4B, respectively. For the pairs of resilient deformation portions 146a and 146b and 246a and 246b, see the section with the explanation of FIGS. 3A and 3B and FIGS. 4A and 4B to be described later.

Also, as to the configuration of the lower contact strips 45 including the resilient deformation portions 46a and 46b, the lower contact strips 45a and 45b of the first and second portions 41a and 41b, which constitute the lower contact strips 45, may be made thinner in advance by being squashed via a press or the like. In any case, the shapes of the paired resilient deformation portion 46 and the lower contact strip 45 including the paired resilient deformation portion 46 can be set to shapes that are appropriate for the shape of the tight wound portion 55 which the resilient deformation portions 46 come into contact with.

Next, the coil spring unit 51 according to this embodiment has a structure that is substantially the same as that of a conventional coil spring unit such as one shown in U.S. Pat. No. 7,677,901 mentioned above. The coil spring unit 51 in this embodiment is a member which forms the probe pin 40 and is configured to hold the plunger 41 thereon in a way that the plunger 41 is movable vertically. The coil spring unit 51 is formed of a metal wire such as stainless steel and a music wire, and constituted mainly of the spring portion 53 and the tight wound portion 55.

The spring portion 53 of the coil spring unit 51 holds the plunger 41 by the supporting portion 52 formed at an upper end thereof, in a way that the plunger 41 is movable vertically. In order to stably hold the plunger 41, the supporting portion 52 of the spring portion 53 is desirably formed by winding the coil in the tightest pitch by about two turns as shown in FIGS. 1A and 1B. The spring portion 53 is expandable and contractible as a compressed coil spring. When assembled as a part of as the IC socket 10 as shown in FIG. 5, the spring portion 53 is compressed in the probe-pin housing space, urges the plunger 41 upward, and urges the tight wound portion 55 downward. In this embodiment, the length of the spring portion 53 (the length in a free state in which no load is applied) is set to be slightly longer than the length of each lower contact strip 45 of the plunger 41.

The tight wound portion 55 of the coil spring unit 51 is a portion that is formed continuously from the spring portion 53, is formed by helically winding the coil in the tightest pitch, and hence does not function as a spring. The tight wound portion 55 according to this embodiment includes the guiding portion 55a formed into a substantially conical shape and the slimly wound portion 55b formed into a cylindrical shape with an outer diameter smaller than that of the spring portion 53.

The guiding portion 55a includes a portion diminishing in diameter in the conical shape from the diameter of the spring portion 53 to the diameter of the slimly wound portion 55b (hereinbelow, referred to as "conical diameter-diminishing portion"). As described above, the conical diameter-diminishing portion of the guiding portion 55a abuts the shoulder portion 35b of the second through-hole 35 of the second base member 30 to hold the coil spring unit 51 within the probe-pin housing space and also to prevent the coil spring unit 51 from coming off from the space. In addition, the slimly wound portion 55b is housed in the small-diameter portion 35c of the second through-hole 35, and a lower end portion thereof is electrically connected to an external contact point of the wiring substrate 80 as the contact point 55c.

Figure 11A:
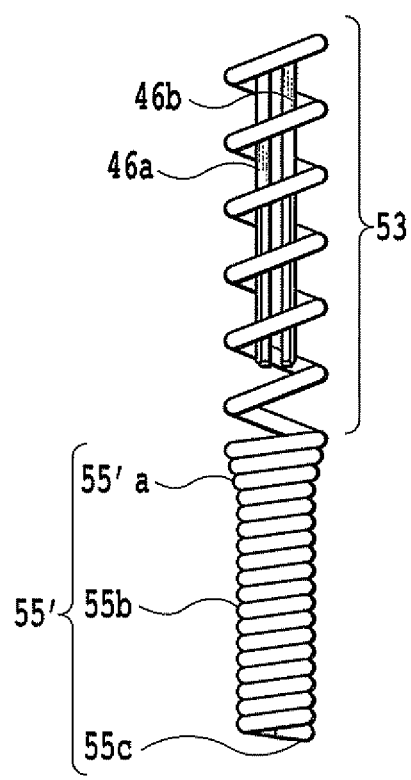
FIG. 11A is a partial enlarged view showing a modification of the coil spring unit of the probe pin shown in FIGS. 1A and 1B, and shows an example where the tight wound portion is formed substantially solely of a slimly wound portion.
Figure 11B:
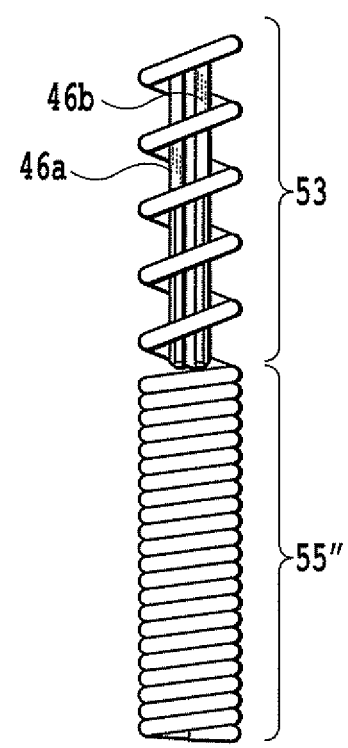
FIG. 11B is a partial enlarged view showing another modification of the coil spring unit, and shows an example where the tight wound portion has the same outer and inner diameters as a spring portion.

In this embodiment, the tight wound portion 55 includes the guiding portion 55a and the slimly wound portion 55b. However, the configuration of the tight wound portion 55 is not limited to this. As shown in FIG. 11A, a guiding portion 55'a which constitutes a tight wound portion 55' may be formed solely of the conical diameter-diminishing portion. Alternatively, as shown in FIG. 11B, a tight wound portion 55" may be formed which has a cylindrical shape with the same outer diameter as that of the spring portion 53. In other words, the conical diameter-diminishing portion of the guiding portion 55a and the slimly wound portion 55b may be eliminated. In such a case, on the paired resilient deformation portions 46a and 46b of the plunger 41, portions may be formed which protrude toward the inner circumferential surface of the tight wound portion 55" so that the paired resilient deformation portions 46a and 46b can come into contact with the inner circumferential surface. Moreover, in the above case, the shoulder portion 35b of the second through-hole 35 of the second base member 30 is eliminated. Thus, the second through-hole 35 is formed solely of the large-diameter portion 35a.

The probe pin 40 according to this embodiment has the configuration described above. Specifically, the first and second portions 41a and 41b are folded together and brought into tight contact with each other. The plunger 41 thus formed to have two tightly overlapping layers has a greater strength, and also the thickness of the plunger 41 (the length in the horizontal direction in FIG. 2D) can be reduced. Accordingly, the width (the length in the horizontal direction in FIG. 2B) and thickness of the plunger 41 can be reduced without deteriorating the strength thereof. Hence, the probe pin 40 is made suitable for the narrower pitch arrangement. Moreover, since the paired resilient deformation portions 46a and 46b of the lower contact strip 45 of the plunger 41 are crushed flatly in advance, it is possible to secure gaps for the resilient deformation of the paired resilient deformation portions 46a and 46b, even when the probe pin 40 is so formed as to be suitable for the narrower pitch arrangement as described above. Accordingly, the paired resilient deformation portions 46a and 46b can securely come into contact with the inner circumferential surface of the tight wound portion 55 (in this embodiment, the inner circumferential surface of the slimly wound portion 55b of the tight wound portion 55), so that a short circuit is created and a high-speed transmission is achieved.

The assembly of the IC socket 10 according to the this embodiment and an operation to electrically connect the IC package 90 to the wiring substrate 80 will be described below in brief.

In a state where the probe pin 40 is assembled as a part of the IC socket 10, the spring portion 53 of the coil spring unit 51 is disposed in the through-holes 25 and 35 while being slightly compressed, as shown in detail in FIGS. 6A and 6B.

In the assembly of the IC socket 10, the probe pin 40 is assembled firstly as shown in FIGS. 1A and 1B by inserting the lower contact strip 45 of the plunger 41 into the spring portion 53 from the supporting portion 52 of the coil spring unit 51.

Subsequently, the probe pin 40 is installed in the probe-pin housing space defined by the first and second through-holes 25 and 35 provided to the respective first and second base members 20 and 30. As a result, the IC socket 10 is assembled as shown in FIGS. 5 and 6A.

As shown in FIG. 6A, the probe pin 40 is housed in the contact housing space or the probe-pin housing space except for a part thereof, in a state where the spring portion 53 of the coil spring unit 51 is slightly compressed. In this state, the upper shoulder portions 44c and 44d of the wide portion 44 of the plunger 41 are in contact with the shoulder portion 25b of the first through-hole 25, and the guiding portion 55a of the coil spring unit 51 is in contact with the shoulder portion 35b of the second through-hole 35. Accordingly, the probe pin 40 is held within the probe-pin housing space defined by the first through-hole 25 of the first base member 20 and the second through-hole 35 of the second base member 30.

FIG. 6B shows a state in which the IC socket 10 is attached on the wiring substrate 80 such as a test board. In this state, the contact point 55c of the slimly wound portion 55b of the coil spring unit 51 of the probe pin 40 comes into contact with the external contact point (not shown) of the wiring substrate 80 and is pushed upward by the wiring substrate 80, so that the spring portion 53 is further but slightly compressed.

Next, FIG. 6C shows a state where the IC package 90 is mounted on the placing recess 21 of the IC socket 10 attached on the wiring substrate 80. In this state, the IC package 90 guided on the probe pin 40 is pushed downward by a predetermined amount toward the probe pin 40 by a not shown pressing member from above. The contact points 42a1, 42a2, 42b1, and 42b2 of the upper contact strip 43 of the plunger 41 of the probe pin 40 come into contact with a lower portion of the solder ball 92 as the external contact point of the IC package 90 at four points so as to surround the lower portion of the solder ball 92. The plunger 41 of the probe pin 40 is displaced downward by a distance which corresponds to the amount of downward pushing of the IC package 90, and compresses the spring portion 53 of the coil spring unit 51 of the probe pin 40. The restoring force of the spring portion 53 as a result of the compression of the spring portion 53 of the coil spring unit 51 determines the contact pressure between the four contact points 42a1, 42a2, 42b1, and 42b2 and the solder ball 92 as well as the contact pressure between the contact point 55c and the external contact point of the wiring substrate 80. As shown in FIG. 7A, the paired resilient deformation portions 46a and 46b of the lower contact strip 45 of the plunger 41 come into resilient contact with the inner circumferential surface of the slimly wound portion 55b of the coil spring unit 51, so that a shorter electric path (signal circuit) is formed. Accordingly, a high-speed signal transmission between the wiring substrate 80 and the IC package 90 is achieved.

Next, modifications of the probe pin according to this embodiment will be briefly described by using FIGS. 3A to 4B and 8A to 11B.

The modification shown in FIGS. 3A and 3B is a modification of the plunger of the probe pin. Upper contact strip 143 of the plunger 141 in this modification, which includes contact point portion 142, are formed by bringing upper contact strips 143a and 143b of respective first and second portions 141a and 141b in the development shown in FIG. 3B into tight contact with each other in a way to completely overlap each other. To be more specific, when the first and second portions 141a and 141b are folded together along the fold line O'-O', the upper contact strips 143a and 143b including contact point portions 142a and 142b formed in the first and second portions 141a and 141b come into tight contact with each other, whereby a united upper contact strip 143 is formed. Note that on the contact point portions 142a and 142b formed in the first and second portions 141a and 141b in this modification, multiple contact points are formed which overlap each other when the first and second portions 141a and 141b are folded together. Thus, multiple contact points are formed on the contact point portion 142 in this modification. In addition, in this modification, wide portion 144 as well as portions of lower contact strip 145 excluding paired resilient deformation portions 146a and 146b are likewise brought into tight contact with each other and united together. Note that the other components of the plunger 141 according to this modification are the same as those of the plunger 41 in the above embodiment, and description thereof is omitted here. These other components of the plunger 141 according to this modification can be understood from the description of the plunger 41 according to the above embodiment by taking "100" out of the reference signs in FIGS. 3A and 3B.

In this modification, paired resilient deformation portions 146a and 146b of the lower contact strip 145 are each formed on either the left or right side of the center line O-O of the corresponding one of the first and second portion 141a and 141b. In this modification, the paired resilient deformation portions 146a and 146b are each formed on the left side of the center line O-O as shown in the development in FIG. 3B. When the first and second portions 141a and 141b are folded together and brought into tight contact with each other, the resilient deformation portions 146a and 146b formed in the above way come to be disposed diagonally with a gap therebetween in the horizontal direction in FIG. 7C as shown by the dashed lines in FIG. 7C. In the side view in FIG. 3A, the paired resilient deformation portions 146a and 146b seem to be in contact but are in fact disposed with a gap therebetween in the direction perpendicular to the document's surface in FIG. 3A. Hence, in this modification, the paired resilient deformation portions 146a and 146b are made deformable in the horizontal and vertical directions as shown by the solid lines in FIG. 7C.

Figure 4A:
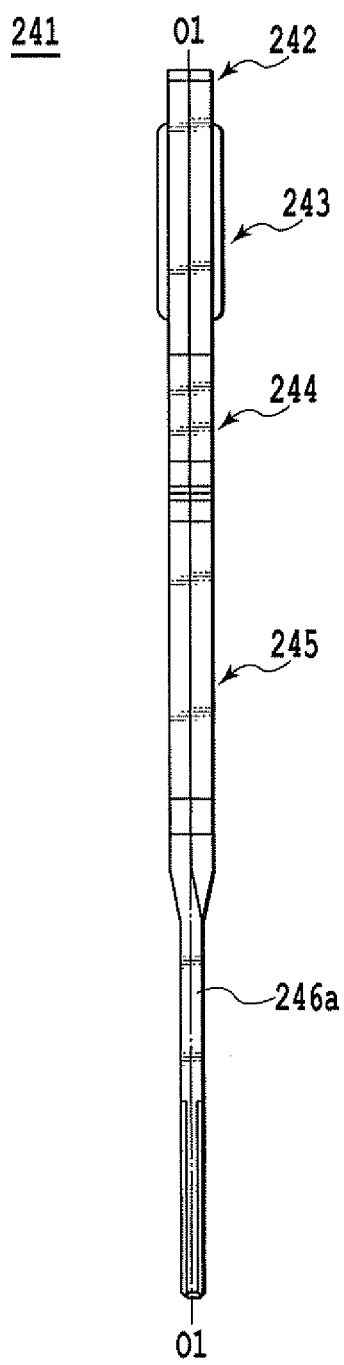
FIG. 4A is a side view showing another modification of the plunger shown in FIGS. 2A to 2E.
Figure 4B:
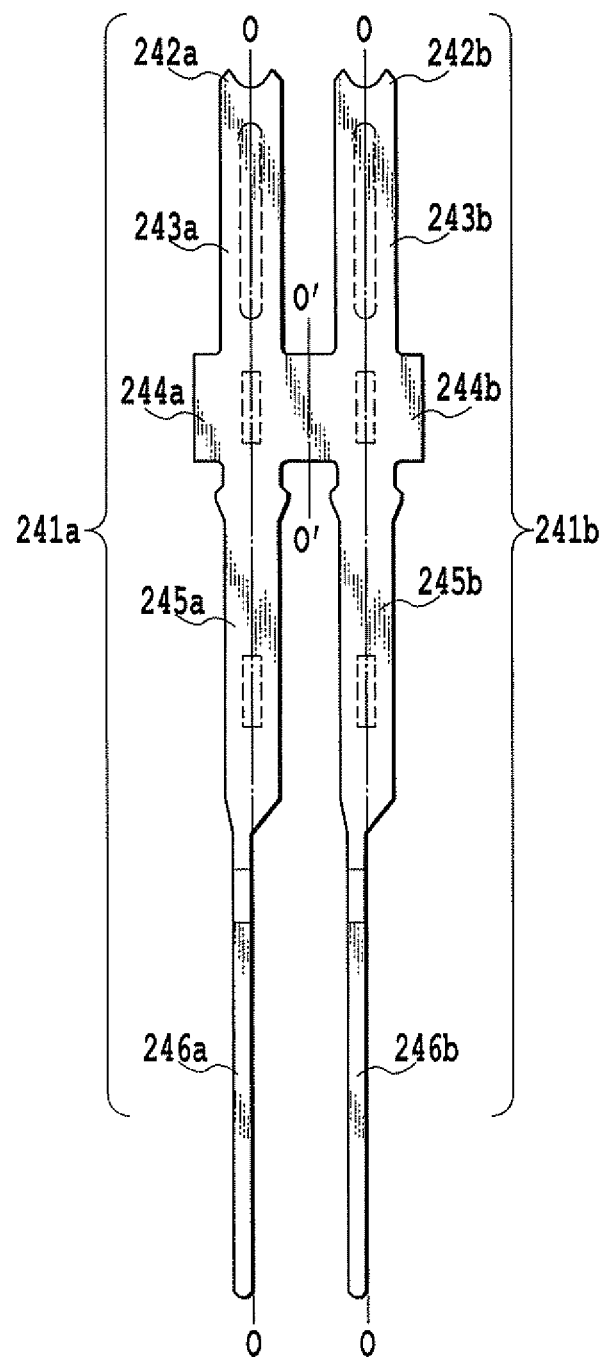
FIG. 4B is a development view of the plunger shown in FIG. 4A.

The modification shown in FIGS. 4A and 4B is another modification of the plunger of the probe pin. The plunger 241 in this modification differs slightly from the above-described modification shown in FIGS. 3A and 3B in terms of the configuration of paired resilient deformation portions 246a and 246b of lower contact strip 245. The other components are completely the same as those of the plunger 141 in FIGS. 3A and 3B. Thus, description will be given only of the configuration of the paired resilient deformation portions 246a and 246b, and description of the other components will be omitted here. Note that these components other than the paired resilient deformation portions 246a and 246b in the modification shown in FIGS. 4A and 4B can be understood from the description of the plunger 141 in FIGS. 3A and 3B or of the plunger 41 according to the aforementioned embodiment by replacing "200" in the reference signs in FIGS. 4A and 4B with "100" or by taking "200" out of these reference signs.

In this modification, the paired resilient deformation portions 246a and 246b of the lower contact strip 245 are each formed on the left of the center line O-O of the corresponding one of the first and second portion 241a and 241b as shown in the development of FIG. 4B. Up to this point, this modification is the same as the above modification shown in FIGS. 3A and 3B. However, in this modification, the resilient deformation portions 246a and 246b formed in the respective first and second portions 241a and 241b are bent in a stepped manner at their root portions at the stage of the development in FIG. 4B. As a result, the resilient deformation portions 246a and 246b are disposed at a front side in the development in FIG. 4B (at a closer side in the direction perpendicular to the document's surface) (see FIG. 4A). When the first and second portions 241a and 241b are folded together and brought into tight contact with each other, the paired resilient deformation portions 246a and 246b formed in the above way appear to overlap each other in the side view as shown in FIG. 4A. The paired resilient deformation portions 246a and 246b formed in the above way are, however, disposed with a gap therebetween in the horizontal direction as shown by the dashed lines in FIG. 7D. Hence, in this modification, the paired resilient deformation portions 246a and 246b are made deformable in the horizontal direction as shown by the solid lines in FIG. 7D.

Next, modifications shown in FIGS. 8A to 10C will be described. Each of these modifications is a modification of the upper contact strip 43 including the contact point portion 42 of the plunger 41 of the probe pin 40 in the aforementioned embodiment.

The modification of the upper contact strips shown in FIGS. 8A to 8C is similar to the above modifications shown in FIGS. 3A, 3B, 4A, and 4B in the following respect. For example, an upper contact strip 43' including a contact point portion 42' are formed by bringing the upper contact strips formed respectively for first and second portions as shown in the development in FIG. 3B into tight contact with each other to unit the upper contact strips together. In this modification, a single contact point portion 42'a1 and a single contact point portion 42'b1 are formed in the first and second portions, respectively. For this reason, when the first and second portions are folded together and brought into tight contact with each other, the contact point portions 42'a1 and 42'b1 overlap each other and form a single contact point portion 42'.

Figure 9A:
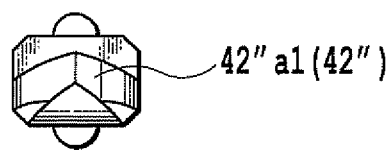
FIG. 9A is a top view showing another modification of the upper contact strips of the plunger shown in FIGS. 2A to 2E.
Figure 9B:
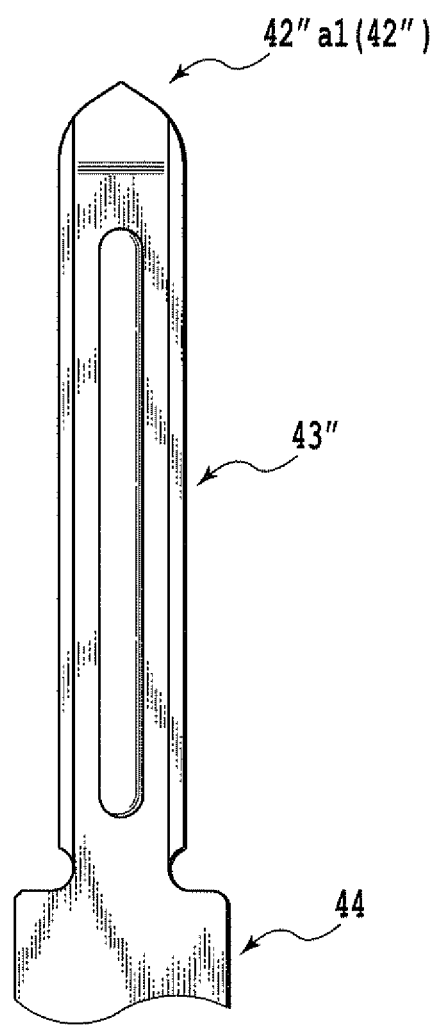
FIG. 9B is a front view of the upper contact strips of the plunger shown in FIG. 9A.
Figure 9C:
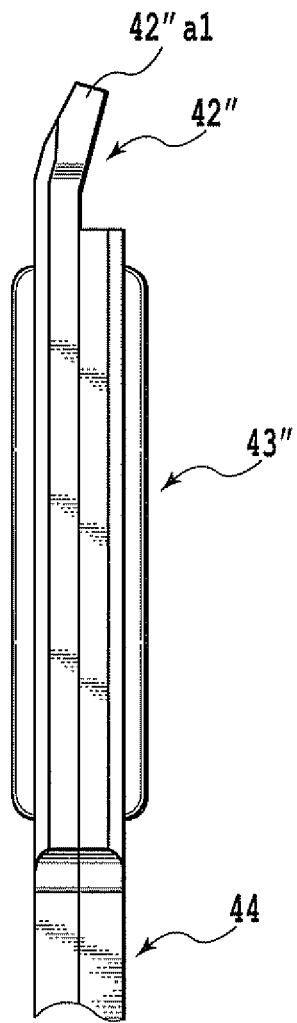
FIG. 9C is a side view of the upper contact strips of the plunger shown in FIG. 9A.

The modification of the upper contact strip shown in FIGS. 9A to 9C differ from the modification shown in FIGS. 8A to 8C only in that, in the development, a contact point portion 42"a1 is formed in either one of the first and second portions of the plunger. Thus, in this modification, a single contact point portion 42" is formed of the single contact point portion 42"a1. In this modification, the contact point portion 42"a1 is tilted with respect to the upper contact strips 43", but is not limited to this. For example, like the modifications shown in FIGS. 10A and 10B, the contact point portion 42" (particularly, 42"a2 or 42"a3) may be formed to extend straightly upward along the upper contact strips 43". Note that upper contact strips of the modifications shown in FIGS. 10A and 10B differ from each other only in the shapes of their contact point portions.

Figure 10A:
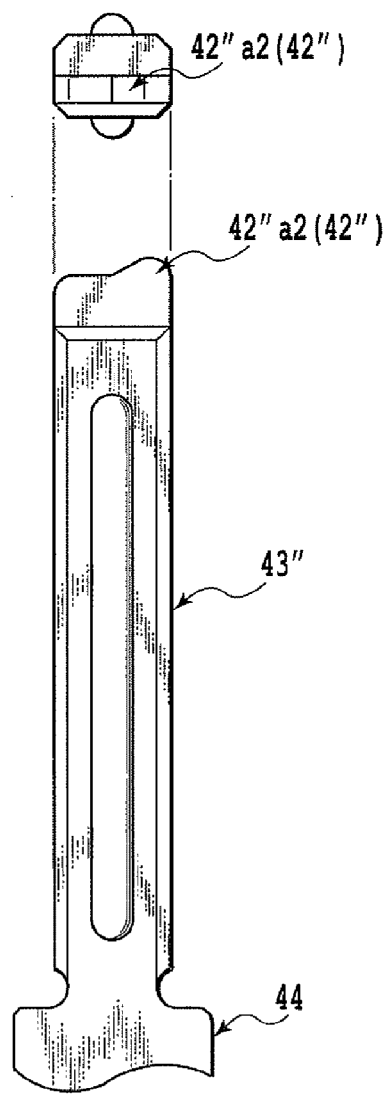
FIG. 10A shows a top view and a front view of yet another modification of the upper contact strips of the plunger shown in FIGS. 2A to 2E.
Figure 10B:
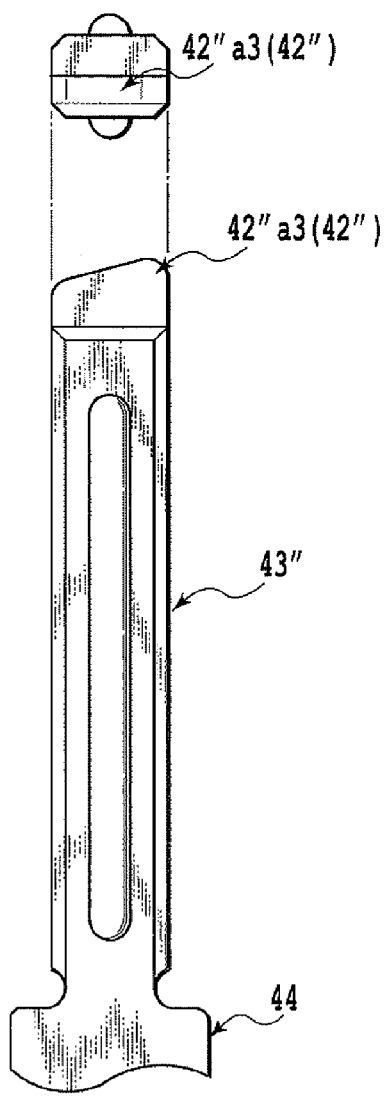
FIG. 10B shows a top view and a front view of a modification of the plunger shown in FIG. 10A.
Figure 10C:
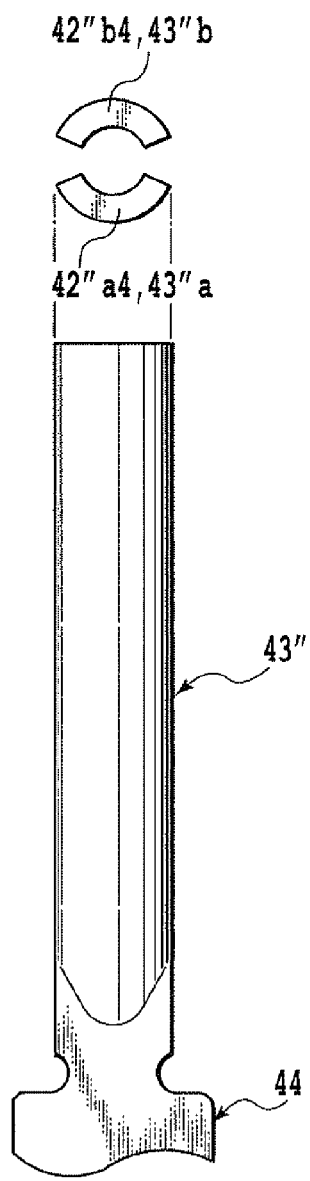
FIG. 10C shows a top view and a front view of still another modification of the plunger shown in FIGS. 8A to 8C.

Lastly, the modification of the upper contact strip shown in FIG. 10C is a case where the upper contact strips 43'''a and 43'''b, which are, in the development, formed respectively for the first and second portion of the plunger, form upper contact strips 43''' with no tight contact between the upper contact strips 43'''a and 43'''b when the first and second portions are folded together. In this modification, the upper contact strip 43''' of the plunger are formed by making thinner in advance the upper contact strips 43'''a and 43'''b, which are formed in the respective first and second portions, by squashing (crushing flatly) them via a press work or the like at the stage of the development. Subsequently, the two upper contact strips 43'''a and 43'''b are each formed into an arc shape in advance so that a horizontal cross section of the upper contact strips 43'''a and 43'''b appears as a substantially circular shape as shown in the top view in FIG. 10C, when the upper contact strips 43'''a and 43'''b are folded together to form the upper contact strip 43''' of the plunger. Thereafter, the first and second portions are folded together along the fold line O'-O' as in the case of the aforementioned embodiment, whereby the plunger is formed. In this modification, no particular contact point portions are provided. The upper ends of the upper contact strips 43'''a and 43'''b function as contact points 42'''a4 and 42'''b4. Meanwhile, as a modification of this modification, it is possible to omit the press work for forming the upper contact strips 43'''a and 43'''b into the arc shape, or to provide contact points on the upper ends of the upper contact strips 43'''a and 43'''b. Alternatively, either one of the upper contact strips 43′′′a and 43′′′b may be eliminated. Then, one of the upper contact strips 43′′′a and 43′′′b that remains may be made thinner in advance by being crushed flatly and so that the upper contact strip 43′′′ can be formed into a substantially cylindrical shape surrounding the center axis O-O.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A probe pin comprising a plunger formed of a sheet metal, and a coil spring unit formed of a metal wire and configured to hold the plunger thereon, wherein:
   in a developed state, the plunger includes a first portion and a second portion each of which has an upper contact strip, a wide portion, and a lower contact strip, and which are connected to each other via the wide portions formed in the first and second portions;
   the plunger is formed in a united manner by folding together the first and second portions along a boundary of the wide portions formed in the first and second portions to thereby bring at least the wide portions formed in the first and second portions into tight contact with each other;
   a resilient deformation portion is formed at a lower portion of each of the lower contact strips formed in the first and second portions; and
   when the first and second portions are folded together to form the plunger, the lower contact strips formed in the first and second portions are brought to come into tight contact with each other except for the resilient deformation portions and form a unitary body whereas the resilient deformation portions form paired resilient deformation portions that are resiliently deformable with respect to each other.

2. A probe pin as claimed in claim 1, wherein:
   a contact point portion having a contact point is formed at an upper portion of each of the upper contact strips formed in the first and second portions; and
   when the first and second portions are folded together to form the plunger, the upper contact strips formed in the first and second portions are brought to tight contact with each other except for the contact point portions and form a unitary body whereas the contact point portions form contact point portions on which a plurality of the contact points are so spread in a plane.

3. A probe pin as claimed in claim 1, wherein:
   a contact point portion having a contact point is formed at an upper portion of each of the upper contact strips formed in the first and second portions; and
   when the first and second portions are folded together to form the plunger, the upper contact strips formed in the first and second portions are brought to tight contact with each other and form a unitary body and the contact point portions form a single contact point.

4. A probe pin as claimed in claim 1, wherein:
   a protrusion is formed on any one of the first and second portions, and an opening or recess is formed in the other of the first and second portions, the protrusion being fitted into the opening or recess when the first and second portions are folded together to form the plunger.

5. An IC socket for electrically connecting a semiconductor device as a first contact object, and a second contact object, comprising at least:
   a base member including a placing recess to house the semiconductor device, and a plurality of through-holes; and
   a plurality of the probe pins as claimed in claim 1, which are held in probe-pin housing spaces defined by the plurality of through-holes, respectively, wherein:
   the upper contact strips of the plungers of the plurality of probe pins come into contact respectively with external contact points of the first contact object; and
   contact points provided to the coil spring units constituting the probe pins come into contact respectively with external contact points of the second contact object.

* * * * *